United States Patent [19]
Dent

[11] Patent Number: 5,742,908
[45] Date of Patent: Apr. 21, 1998

[54] FREQUENCY ERROR CORRECTION IN A SATELLITE-MOBILE COMMUNICATIONS SYSTEM

[75] Inventor: Paul W. Dent, Stehags, Sweden

[73] Assignee: Ericsson Inc., Research Triangle Park, N.C.

[21] Appl. No.: 305,784

[22] Filed: Sep. 14, 1994

[51] Int. Cl.⁶ .................................................. H04B 7/185
[52] U.S. Cl. .......................... 455/517; 455/12.1; 455/575; 455/63; 455/427; 342/358
[58] Field of Search ..................... 455/12.1, 13.1, 455/24, 51.1, 54.1, 54.2, 67.1, 68, 69, 71, 75, 76, 88, 260, 63, 9.427, 501–502, 504, 505–506, 517, 575; 342/357, 358; 340/991, 988; 364/459

[56] References Cited

U.S. PATENT DOCUMENTS

| | | | |
|---|---|---|---|
| 5,287,541 | 2/1994 | Davis et al. | 455/13.1 |
| 5,313,215 | 5/1994 | Walker et al. | 455/12.1 |
| 5,343,512 | 8/1994 | Wang et al. | 455/12.1 |
| 5,432,521 | 7/1995 | Siwiak et al. | 455/12.1 |
| 5,471,648 | 11/1995 | Gourgue | 455/12.1 |
| 5,552,795 | 9/1996 | Tayloe et al. | 455/12.1 |

FOREIGN PATENT DOCUMENTS

| | | | |
|---|---|---|---|
| 3131131 | 6/1991 | Japan | 455/33.1 |
| 4207530 | 7/1992 | Japan | 455/12.1 |

*Primary Examiner*—Reinhard J. Eisenzopf
*Assistant Examiner*—Doris To
*Attorney, Agent, or Firm*—Burns, Doane, Swecker & Mathis, L.L.P.

[57] ABSTRACT

Mobile stations correct their frequencies using a signal received from the moving relay station including correction of any Doppler shift caused by the satellite's movement. The mobile station includes a receiver for receiving a paging channel signal broadcast by the moving relay station and demodulators and decoders for decoding the information in the paging channel signal. Using the decoded information, the mobile station can determine an estimate of its position within the communication system. The mobile station can also determine a frequency error and a Doppler shift using the decoded information and the position estimate. A frequency controlling signal is determined using the determined frequency error and the Doppler shift. A controlled reference oscillator then uses the frequency correcting signal as a control input signal. Finally, the mobile station contains a transmitter for transmitting a signal using the voltage controlled oscillator as a reference.

4 Claims, 4 Drawing Sheets

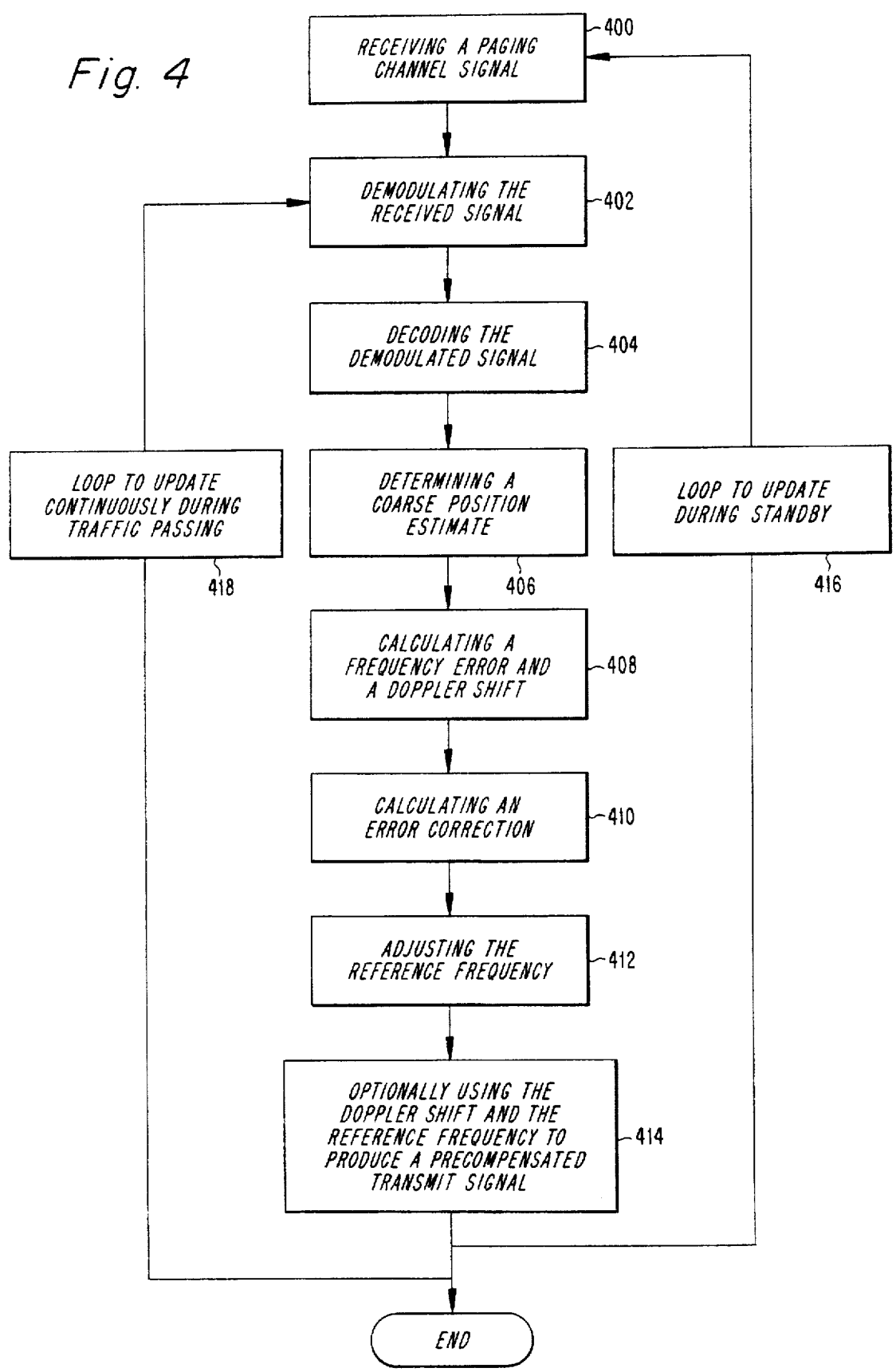

FREQUENCY ERROR CORRECTION IN A SATELLITE-MOBILE COMMUNICATIONS SYSTEM

FIELD OF THE INVENTION

The present invention relates to a system for bidirectional communication with mobile telephones via a moving relay station, such as an orbiting satellite. In a satellite mobile communications system, the motion of the satellite causes the radio frequency of the satellite's transmissions, as perceived by the mobile stations, to be altered by Doppler effect. If mobile stations lock their internal frequency standards to the perceived satellite signal, they will be in error and so the frequencies transmitted from the mobile stations back to the satellite will also be incorrect. Moreover, the signals from the mobile stations back to the satellite will again be shifted by the Doppler shift so that the frequency as perceived at the satellite is doubly in error. More specifically, the present invention relates to a method and apparatus whereby mobile stations can correct their frequencies using a signal received from the moving relay station including correction of any Doppler shift caused by the satellite's movement.

BACKGROUND OF THE DISCLOSURE

Since the relay station or satellite motion is presumed known to the communication network, the main ground network station can in principle pre-compensate the frequency used to broadcast the signal so that it is correctly perceived by a mobile station. However, since the Doppler shift perceived at a mobile station depends on the mobile station's position, different pre-compensation is needed for every signal being transmitted to each mobile station. Thus, the technique of precompensation is not a feasible solution for cases where all mobiles receive the same signal, for example, the calling or paging channel of a satellite-based mobile telephone system.

The prior art contains examples of broadcasting a frequency or time standard from a moving satellite. The Global Positioning Satellite (GPS) system is an example of such a system. The Global Positioning Satellite system as its name implies is a satellite navigation system whose principal purpose is to allow ground based receivers to determine their position. By knowing their position and details of the satellites' systematic motion, the Doppler shift can be determined at each mobile station and the satellite signals corrected accordingly, thus affording a frequency reference. In order to determine the three spatial coordinates and the unknown time/frequency parameter needed to determine the Doppler shift, the receiver must be able to receive signals from four satellites simultaneously. The GPS system is not a communications system and the navigation receivers do not have associated transmitters that will transmit signals to the satellites. In addition, the GPS receivers do not normally attempt to determine a position or frequency reference based on listening to signals from a single satellite.

The prior art contains examples of reference oscillators based on remembering a previous correction in a temperature look-up table memory. New frequency errors subsequently determined at a temperature encountered previously are averaged with the previous value at that temperature in order to update look-up table contents. Such a system has been used in hand portable cellular phones manufactured by Ericsson-GE in Lynchburg, Va. since 1991 and manufactured in Lund, Sweden since 1987. Thus it is possible using that prior art method to provide a good estimate of required frequency corrections by measuring the temperature and using the current average of previous corrections made at the same temperature, even before a new frequency error determination has been completed. However, the prior art method does not include Doppler correction prior to TCXO memory updating.

SUMMARY OF THE DISCLOSURE

It is an object of the present invention to allow mobile stations to determine their coarse position by listening to a paging channel of a satellite for the purpose of then determining the approximate Doppler shift of the received signal with the aid of data describing the satellite's motion broadcast from the satellite on the calling channel. The Doppler shift is then removed before the mobile stations correct their reference oscillators. Moreover, the determined Doppler shift computed is also used in determining a frequency offset relative to the reference oscillator to be applied in generating a transmitted signal from the mobile station such that it is received at the satellite at a correct and desired frequency.

According to one embodiment of the present invention, the mobile station contains a plurality of elements which combine for communicating via a moving relay station. First, the mobile station includes a receiver means for receiving a paging channel signal broadcast by the moving relay station and demodulating and decoding means for decoding the information in the paging channel signal. Using the decoded information, the mobile station can determine an estimate of its position within the communication system. The mobile station also has means for determining a frequency error and a Doppler shift using the decoded information and the position estimate. A frequency correcting means determines a frequency controlling signal using the determined frequency error and the Doppler shift. A controlled reference oscillator then uses the frequency correcting signal as a control input signal. Finally, the mobile station contains a transmitter means for transmitting a signal using the voltage controlled oscillator as a reference.

According to another embodiment of the present invention, the mobile station contains a plurality of elements which combine for communicating via a moving relay station. First, the mobile station includes a receiver for receiving a paging channel signal broadcast by the relay station and demodulating and decoding means for decoding the information the paging channel signal. Using the decoded information, the mobile station can determine a position estimate of its position within the communication system. The mobile station also has means for determining a frequency error and a Doppler shift using the decoded information and the position estimate. The mobile station also includes a temperature sensor means for making a coarse temperature measurement and a memory means for storing averaged frequency control signal values for each of a number of temperatures. A frequency correcting means determines a frequency controlling signal based on the determined frequency error and Doppler shift or based on the stored values and the coarse temperature measurement. An averaging means averages the stored average values with the frequency correcting signal values and stores the average values in the memory in positions determined by the temperature measurements. A controlled crystal oscillator means has a control input for the frequency correcting signal. Finally, the mobile station contains a transmitter means for transmitting a signal using the controlled oscillator as a reference.

BRIEF DESCRIPTION OF THE DRAWINGS

These and other features and advantages of the invention will be readily apparent to one of ordinary skill in the art

Figure 1:
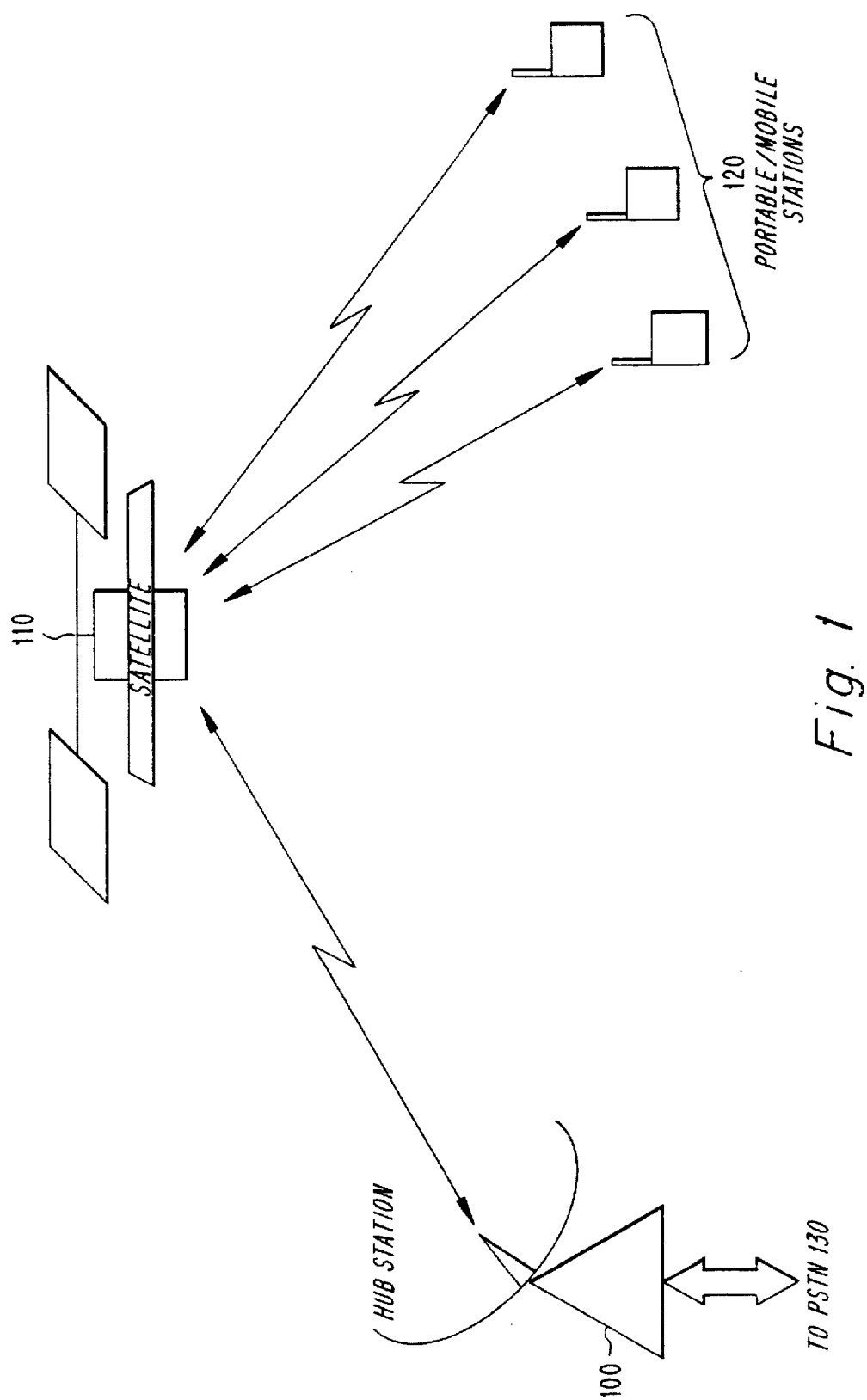
Figure 2:
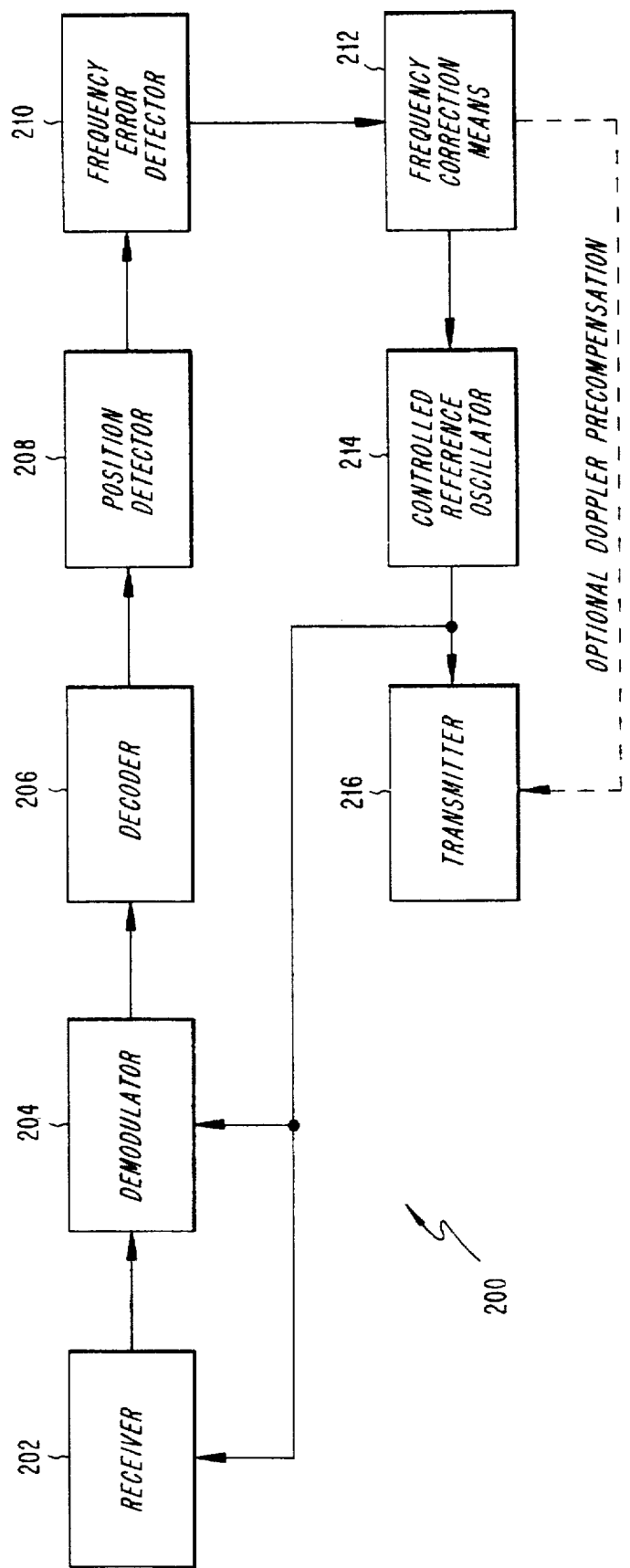
Figure 3:
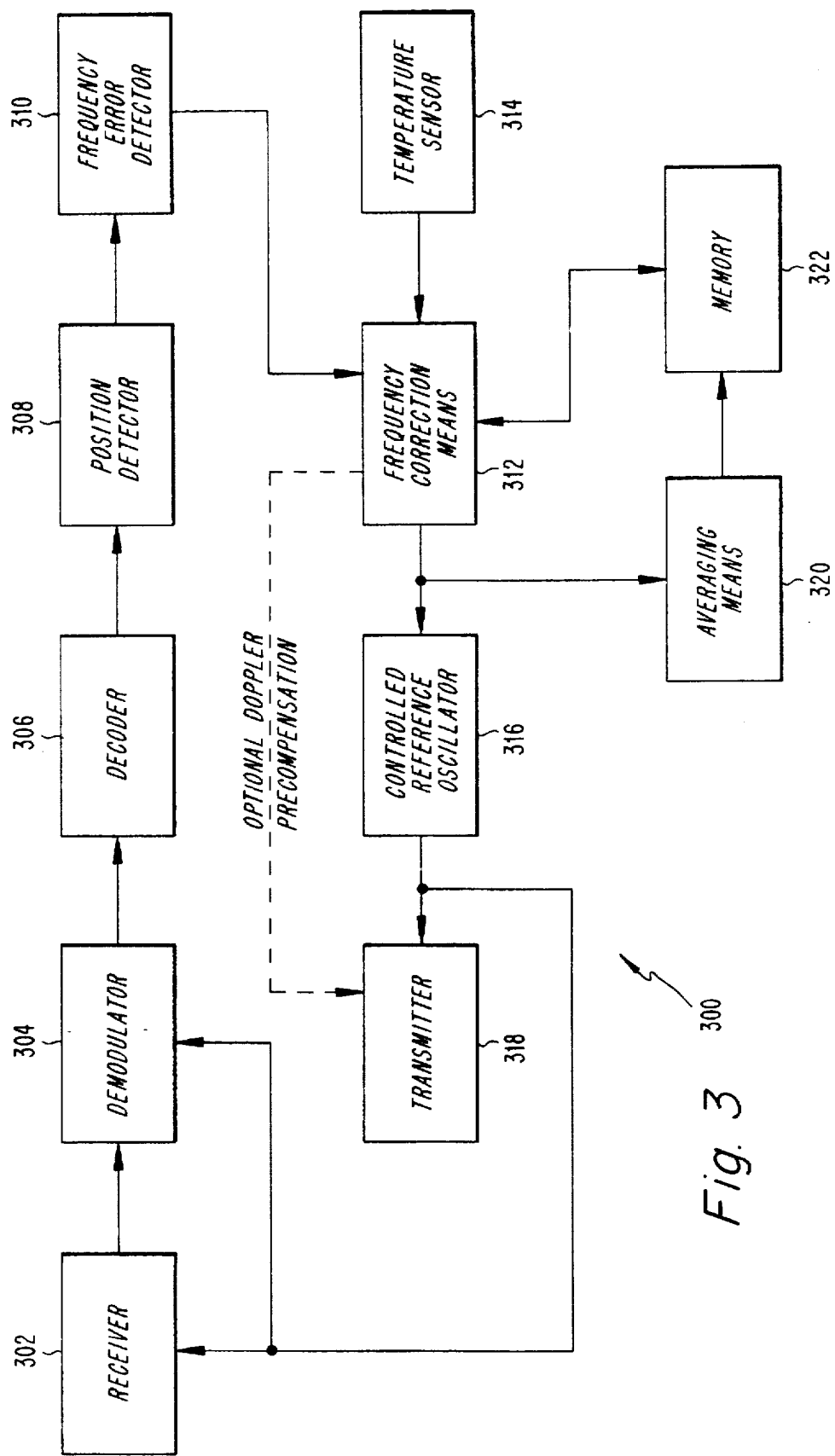

3 from the following written description, used in conjunction with the drawings, in which:

FIG. 1 illustrates a general satellite communication system;

FIG. 2 illustrates a mobile station according to one embodiment of the present invention;

FIG. 3 illustrates a mobile station according to another embodiment of the present invention; and FIG. 4 illustrates a flow chart of one embodiment of the present invention.

DETAILED DESCRIPTION OF THE DISCLOSURE

FIG. 1 illustrates a block diagram of a satellite communication system. An orbiting satellite 110 is in communication with at least one ground station or hubstation 100 as well as a plurality of mobile stations 120. The satellite contains a multiple beam antenna. The mobile stations are each serviced by an appropriate antenna spot beam from the multiple beam antenna. The hubstation 100 communicates with the satellite using, for example, C-band or Ka-band frequencies, while the satellite communicates with the mobile stations using, for example, L-band frequencies in the uplink direction and S-band frequencies in the downlink direction. In most cases, most calls will be between mobile stations and ordinary telephones connected to the Public Switched Telephone Network (PSTN) 130. The hubstation 100 accepts calls from the PSTN 130 and relays them to the mobile stations 120 via the satellite 110, and conversely accepts calls from the mobile stations 120 relayed from the satellite 119 and connects the calls to the PSTN 430. A small percentage of the calls may be mobile station to mobile station calls, where the hubstation 100 directly connects the mobile stations to each other without necessarily involving the PSTN. In some systems, two or more hubstations located in different parts of the world communicate with the same satellite. In this case, mobile to mobile calls may involve hubstation to hubstation connections which can be accomplished through international trunk lines that may be part of the PSTN system. Alternatively, the satellite-hubstation links can allocate some capacity for hubstation to hubstation communication via the satellite for such occurrences thus avoiding landline tariffs.

In each antenna beam, one of the relayed signals performs the function of calling channel (paging channel) and broadcast channel. This channel carries system information needed by the mobile stations in that beam (the broadcast information, e.g. beam ID, satellite motion information etc) and also information addressed to individual mobile stations (network originated calls or pages). Since each calling channel is intended for reception only by mobiles stations in its beam, the Doppler shift can in principle be coarsely corrected for the mean perceived by all mobile stations in the beam. For example, the Doppler shift can be arranged to be zero at the center of the beam. An example of ground station and satellite architectures suitable for implementing the invention may be found in U.S. patent application Ser. No. 08/179,953, entitled "A Cellular/Satellite Communications System With Improved Frequency Reuse", which is hereby incorporated by reference.

In low-orbiting satellites, the Doppler shift varies from place to place on the earth and the Doppler shift at the edges of the beam will differ from the Doppler shift at the center of the beam. Consequently, the Doppler shift at the edges of the cell will be non-zero even when the Doppler shift has been precompensated to be zero at the center of the cell. The maximum cell edge Doppler errors occur in this case when the satellite is most nearly overhead and the rate of change of Doppler with position is greatest. Thus in order to more accurately correct for Doppler shift, a mobile station needs some knowledge of its position within the current cell or beam. This position information should, in contrast with GPS, be obtainable by listening to a single satellite.

A mobile station according to one embodiment of the present invention is illustrated in FIG. 2. The mobile station 200 contains a receiver 202 and a transmitter 216 which are used to communicate with a hubstation via a moving relay station. As stated above, the relay station or satellite broadcasts a paging channel signal in each antenna beam. When the receiver 202 receives a paging channel signal from the satellite, the received signal is demodulated in a known manner in a demodulator 204. The demodulated signal is then decoded in a decoder 206 to extract the information contained in the received signal. Using the decoded information, the mobile station can determine a coarse estimate of its position within the antenna beam or cell.

One such method the mobile station can use to determine its position is the so-called TRANSIT satellite navigation solution. TRANSIT satellite receivers determine the Doppler shift several times during the overhead passage of the satellite. With several samples on the curve of Doppler shift with time, plus information broadcast by the satellite on its orbit trajectory, a mobile station can compute its position to within a few hundred meters accuracy. This process normally takes a period of time which would be considered excessive in the current context, where a mobile station should be in a position to make or receive calls within a few seconds after being switched on. However, the TRANSIT method provides much greater accuracy than is needed for satellite communications. Typically, spot beam diameters on the ground in a satellite system may be several hundred kilometers in diameter, and the differential Doppler shift after precompensation across such a cell may be ±2 KHz. Thus knowledge of a mobile's position within a cell to an accuracy of a few kilometers will enable determination of uncompensated Doppler shift to about ±20 Hz. As a result, it is possible that a modification of the TRANSIT solution may be suitable for the present invention and the present invention is not limited to any particular modification. However, a preferred method is disclosed in U.S. patent application Ser. No. 08/179,958, entitled "Position Registration For Cellular Satellite Communication Systems" and U.S. patent application Ser. No. 08/179,953, entitled "A Cellular/Satellite Communications System With Improved Frequency Reuse", both of which are commonly assigned and expressly incorporated herein by reference.

One system disclosed therein comprises radiation from the satellite of a large number of largely overlapping beams with gradually staggered overlap. Each overlapping beam is used for a particular communications channel. In the present invention, the term "channel"can be meant either as a frequency (in an FDMA system), a timeslot (in a TDMA system) or spreading code (in a CDMA system) or any combination thereof in hybrid modulation systems. The beam of channel 1 has, for example, 90% overlap with the beam of channel 2.80% overlap with the beam of channel 3.70% overlap with the beam of channel 4 and so on till zero overlap with the beam of channel 11, which can therefore re-use the same frequency, timeslot or code of channel 1. The above example was simplified to a one-dimensional pattern of beams for the purpose of illustration, and in practice a two-dimensional re-use pattern of gradually staggered overlap is used.

A mobile station will receive most strongly the channel in whose associated beam the mobile is most nearly centrally located. Thus by relative signal strength measurements on the overlapping channels, the mobile station can obtain a coarse position estimate suitable for the purposes of the present invention. In particular, when the satellite signal is a TDMA signal, and the partially overlapping beams are linked to timeslots, the mobile receiver can merely listen to the single frequency of the TDMA carrier and sample signal strength on sequential timeslots during the frame. Moreover, the repetition of the frame allows measurements to be averaged over several frames for enhanced accuracy.

Once the position of the mobile station has been determined, a frequency error detector 210 uses the determined position as well as the information broadcast by the satellite describing the satellite's systematic motion to determine a frequency error and a doppler shift of the received signal. According to one embodiment of the present invention, the satellite can precompensate its transmit frequency so that the error due to Doppler is cancelled at the center of the cell or beam. However, the error will be non-zero off-center in a direction in the plane containing the sightline and the orbital velocity vector. The satellite can broadcast the magnitude of the rate of change of frequency along an East-West line and a North-South line from the cell center. Since the mobile determines its position with respect to the cell center, it can calculate the magnitude of the uncompensated Doppler shift at the mobile's location and subtract the magnitude of the Doppler shift from an absolute frequency measurement made by the mobile's receiver. For example, if in beam 1 the satellite broadcasts the information that frequency changes off center by ±7 HZ/km along the East-West line and −3 HZ/km along the North-South line and the mobile determines that it is 100 km west and 200 km south of the cell center, then the frequency error will be (7×100)−(3×200)=100 HZ.

Alternatively, if the satellite broadcasts that the frequency error changes at 10 HZ/km off cell-center along the line North 40 West, and the mobile determines that it is 100 km North 30 East of the cell center, then the frequency error will be estimated as (10 HZ)x(cos(70)).

The above methods are illustrative only. In general, the satellite could broadcast not only Doppler estimation parameters for every beam, but also the formula for using the parameters. All such methods are considered to be within the scope of the present invention. The frequency correction means 212 then uses the error signal to calculate a frequency correction signal to correct the perceived satellite signal frequency for the uncompensated Doppler shift. The frequency correction signal is then used by a voltage controlled oscillator 214 to correct the reference signal supplied to the transmitter 216 for transmission back to the satellite when the mobile station initiates or replies to a call.

It is optional whether the mobile station applies a further Doppler shift precompensation to its transmission such that it is received correctly at the satellite. Whether this is necessary depends on the channel spacing between different mobile signals. If the frequency spacing is small and the Doppler shift is a significant fraction, precompensation on the return link (uplink) would be appropriate. In this case any residual Doppler shift experienced by the satellite can be due to errors in mobile station position determinations caused by errors in the information broadcast by the satellite. By averaging residual errors over many independent mobile station signals, the satellite can correct the broadcast information to remove systematic errors and thus the system becomes self-calibrating. For this purpose, the mobile station shall report position-related information during calls, appropriately using for this purpose the Slow Associated Control Channel (SACCH) in the uplink direction. The SACCH information is multiplexed with traffic (e.g. speech) information in transmissions from mobile to satellite.

On the other hand, if the uplink transmissions are wideband signals in comparison with uplink Doppler shift then it is not essential to precompensate for the uplink Doppler shifts. In this case, the satellite relays the signals to the ground network station that determines the uplink Doppler shift for each mobile station during demodulation of their relayed signals. The value of the uplink Doppler shift in comparison to the expected cell-center value provides an indication of mobile displacement from cell center that complements any additional position clues such as signal strength measurements. Such information may be used in determining an optimum channel assignment to use for communicating with each mobile station.

Another embodiment of the present invention is illustrated in FIG. 3, wherein the mobile station illustrated in FIG. 2 also has the capability of measuring the temperature when a paging signal is received. The mobile station 300 contains a receiver 302, a demodulator 304, a decoder 306, a position detector 308, and a frequency error detector 310 all of which operate in a manner similar to those elements described in FIG. 2. In this embodiment of the present invention, the frequency correction means 312 can use several methods to determine a frequency correction signal. In the first method, the frequency correction means 312 can use the error signal produced by the frequency error detector 310 to determine the frequency correction signal as described above with regard to FIG. 2. Alternatively, the frequency correction means 312 can use frequency control values stored in the memory means 322 to determine the frequency correction signal. When the mobile station 300 receives a paging signal, the temperature sensor 314 measures the temperature near the mobile station's reference oscillator. The frequency correction means 312 then selects a frequency control signal value from the memory 312 based upon the temperature measured by the temperature sensor 314. In addition, the mobile station 300 may contain an averaging means 320 for averaging the stored frequency control signal values with the produced frequency correction signal. The averaged value can then be stored in the memory 322 in the correct position determined by the measured temperature. The frequency correction signal output by the frequency correction means 312 is used to adjust the frequency of the reference signal produced by the controlled reference oscillator 316, which is supplied to the transmitter 318.

Another embodiment of the present invention provides a method whereby a mobile station can correct its frequency using a signal received from a satellite. As illustrated in FIG. 4, after the mobile station receives a signal in the paging channel in step 400, the received signal is demodulated and decoded in steps 402 and 404, respectively. The mobile station then uses the decoded information to determine a coarse estimate of its position within a beam, in step 406. After the mobile station has determined its position, a frequency error and a Doppler shift can be computed in step 408. By using the determined frequency error and the Doppler shift, the mobile station calculates a frequency correction signal in step 410. Finally, the mobile station can use the frequency correction signal to adjust the reference signal produced by a controlled reference oscillator, such as a voltage controlled oscillator, in step 412, which is then applied to the mobile station's transmitter. In addition, the doppler shift and the reference frequency can optionally be used to produce a precompensated transmit signal in step

414. Finally, the method can loop to either update during in step 416, or to update continuously during traffic passing in step 418.

The invention disclosed above avoids the need to include a costly, highly accurate reference frequency source in mobile phones, allowing the reference frequency to be determined by listening to the calling/paging channel. The Doppler shift on the paging channel signal is corrected by use of a coarse position estimate in order to obtain said frequency reference which is then used to determine an accurate transmission frequency from said mobile station.

It will be appreciated by those of ordinary skill in the art that the present invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What we claim is:

1. A mobile station for use in a satellite communication system with at least one moving relay station, comprising:

receiver means for receiving a paging channel signal broadcast by said relay station;

means for demodulating said paging channel signal to produce a demodulated signal;

means for decoding said demodulated signal to produce a decoded signal;

means for determining a position estimate of said mobile station;

means for determining a frequency error and a Doppler shift using said decoded signal and said position estimate;

temperature sensor means for making temperature measurements;

memory means for storing average frequency control signal values for each of a plurality of temperatures;

frequency correcting means for determining a frequency correcting signal based on said determined frequency error and Doppler shift or based on said stored values and said temperature measurement;

averaging means for averaging said stored average values with frequency-correcting signal values and storing said average values in said memory means in positions determined by said temperature measurements;

controlled oscillator means having a control input for a frequency-correcting signal; and transmitter means for generating a transmit signal using said controlled oscillator means as a reference.

2. The mobile station according to claim 1, wherein said moving relay station is an orbiting satellite.

3. The mobile station according to claim 1, wherein said position estimate is within several kilometers of an actual position of said mobile station.

4. The mobile station according to claim 1, wherein said paging signal contains information about the relay station's motion.

* * * * *